United States Patent [19]

Hilbrink

[11] Patent Number: 5,303,119
[45] Date of Patent: Apr. 12, 1994

[54] INTERCONNECTION SYSTEM FOR INTEGRATED CIRCUITS

[75] Inventor: Johan O. Hilbrink, Blue Ash, Ohio

[73] Assignee: NCR Corporation, Dayton, Ohio

[21] Appl. No.: 60,677

[22] Filed: May 11, 1993

Related U.S. Application Data

[63] Continuation of Ser. No. 735,749, Jul. 25, 1991.

[51] Int. Cl.⁵ .............................................. H05K 1/00
[52] U.S. Cl. .................... 361/749; 361/744; 361/784; 361/807; 174/255; 174/261; 257/700
[58] Field of Search ............... 361/729, 736, 744, 749, 361/784, 785, 792, 807, 810, 791, 790, 803; 174/261, 255; 257/680, 700

[56] References Cited

U.S. PATENT DOCUMENTS

| | | |
|---|---|---|
| 4,417,392 | 11/1983 | Iprahim et al. . |
| 4,685,033 | 8/1987 | Inoue . |
| 4,721,831 | 1/1988 | Vora . |
| 4,754,371 | 6/1988 | Nitta et al. . |
| 4,837,408 | 6/1989 | Kondo et al. . |
| 4,860,165 | 8/1989 | Cassinelli ............................ 361/388 |
| 4,864,722 | 9/1989 | Razzarini et al. . |
| 4,872,934 | 10/1989 | Kameda . |
| 4,882,657 | 11/1989 | Braun ................................. 361/412 |
| 4,935,584 | 6/1990 | Boggs . |
| 4,954,878 | 9/1990 | Fox et al. ............................. 357/81 |
| 4,963,697 | 10/1990 | Peterson et al. . |
| 4,965,702 | 10/1990 | Lott et al. . |
| 5,028,473 | 7/1991 | Vitriol et al. ........................ 428/137 |
| 5,136,471 | 8/1992 | Inasaka ............................... 361/414 |

FOREIGN PATENT DOCUMENTS 0232533  12/1986  European Pat. Off. .

OTHER PUBLICATIONS

IBM Technical Disclosure Bulletin, vol. 30, No. 2, Jul. 1987, pp. 772-773.

*Primary Examiner*—Leo P. Picard
*Assistant Examiner*—Young Whang
*Attorney, Agent, or Firm*—Paul W. Martin; Gregory A. Welte

[57] ABSTRACT

The invention concerns a carrier for Integrated Circuits (ICs). The ICs are carried by a multi-layer board, constructed of individual layers. Some layers carry conductive traces, and the traces are connected together to form a 3-dimensional network connecting the ICs. The individual layers are constructed of a flexible material, which is commercially available in large sheets, thus allowing multiple copies of the trace patterns to be printed simultaneously. The multi-layer board is attached to a standard printed circuit board, by pins which are driven through them both, and soldered into place.

1 Claim, 8 Drawing Sheets

INTERCONNECTION SYSTEM FOR INTEGRATED CIRCUITS

This is a continuation of co-pending application Ser. No. 07/735,749 filed on Jul. 25, 1991.

The invention relates to apparatus for interconnecting integrated electronic circuits.

BACKGROUND OF THE INVENTION

The speed at which microprocessors can execute instructions has increased dramatically in recent years. The increase in speed has been so great that propagation delays in data travelling to and from the microprocessor chip have become a limitation on processor performance.

As an example, the 8080 microprocessor, which was introduced around 1973, commonly operated at a clock speed of 1 MegaHerz (MHz). Each instruction requires between 3 and 5 clock cycles, giving a resulting speed of approximately 200,000 to 300,000 instructions per second. In contrast, a processor of the '486 family, available in 1991, can have a clock rate of 50 MHz. A typical instruction requires about 2.5 clock cycles, resulting in a speed of about 20 million instructions per second. Plainly, this speed is about 100 times faster than that of the 8080 processor.

In order to reduce propagation delays between the microprocessor and associated memory components, developers have devised ways to pack large numbers of ICs onto small carriers. One such carrier is the Multi-Chip Module, or MCM, shown in FIG. 1. The MCM is a multi-layered structure, in which conductors 3 interweave among themselves to interconnect between the ICs and external traces 6. The interweaving can be explained by reference to FIG. 2. Different layers 9 and 12 carry different patterns 15 and 18 of conductors 20. When the layers are assembled, vias 21 connect the patterns, and the assembly provides a 3-dimensional interwoven connection system, which allows any arbitrary point A to connect with any other arbitrary point B, as indicated by dashed path D.

Several types of MCM are in use. One type is constructed of multi-layered printed-circuit boards. The conductive patterns are printed using silk-screen techniques, and have a line width limit of about 0.005 inches (i.e., about 5 mils). (The limit refers to a minimum width of lines: the narrowest line possible is 5 mils. Line width is inversely proportional to interconnect density. The lines are referred to as interconnects, and narrower lines allow more of them to be packed into a given space, thus increasing the density, measured in number of lines per square inch.)

With such a large line width, the density of lines is small, compared to that available in other approaches, as will be seen. However, the cost is relatively low. A single, completed, pattern-bearing layer costs roughly 10 cents per square inch. A 10-layer board would thus cost about $1.00 per square inch.

A second type utilizes ceramic layers on which the patterns are printed by a silk-screen process. The line width is about 5 mils. For single layers in the form of squares about 2×2 inches or smaller, the price is roughly $1.00 per square inch. For larger sizes, the price increases significantly.

A third type utilizes copper polyimide layers positioned on top of ceramic layers. The printing process is photolithography, which can provide a minimum line width of less than 1 mil. However, the present cost is roughly $32 per square inch for a four-layer unit.

A fourth type uses silicon layers, with photolithographic printing. The line width can be less than 1 mil, and the cost is about $15 per layer, totaling about $60 for four layers.

The cost estimates given above are approximate, and can vary greatly, depending on numerous factors, such as quantity purchased, previous dealings between the parties, and complexity of the conductor patterns.

In these types of MCM, the cost increases as line width becomes smaller. Smaller line widths are required for higher IC densities. Consequently, as IC densities increase, these types of MCM will impose higher costs.

OBJECTS OF THE INVENTION

It is an object of the invention to provide an improved interconnection system for integrated circuits.

It is a further object of the invention to provide an interconnection system providing high IC density, yet with low cost.

SUMMARY OF THE INVENTION

In one form of the invention, an MCM is stacked atop a PC board, such that conductive pads on the MCM are in registration with conductive traces on the PC board. Holes are positioned in both the PC board and the MCM so that pins may be inserted, each of which runs from a respective pad to a respective trace. The pins are then soldered to the pads and traces, providing both mechanical support and electrical connections. The MCM can be constructed of multiple layers of flexible sheeting, on which patterns of copper conductors have been formed.

An exemplary form of the invention consists of a Multi-Chip Module consisting of (A) two layers of high-density interconnect (i.e., line widths of about 1 mil or less) connecting the integrated circuits (ICs) together, and (B) two layers of conventional printed circuit boards which support the two layers of interconnect. The printed circuit boards distribute power to the ICs and also carry signals between the ICs and external sources.

The exemplary form is significantly less expensive than the approaches outlined in the Background, for a comparable interconnect density. That is, in the invention, the two layers of high-density interconnect have a final cost of about $1.00 per square inch. The two layers of conventional PC board cost about $0.10 per square inch, giving a total cost of $2.20 per square inch. This cost is significantly less than that of copper polyimide layers over ceramic, costing about $32.00 per square inch.

DETAILED DESCRIPTION OF THE INVENTION

Figure 3:
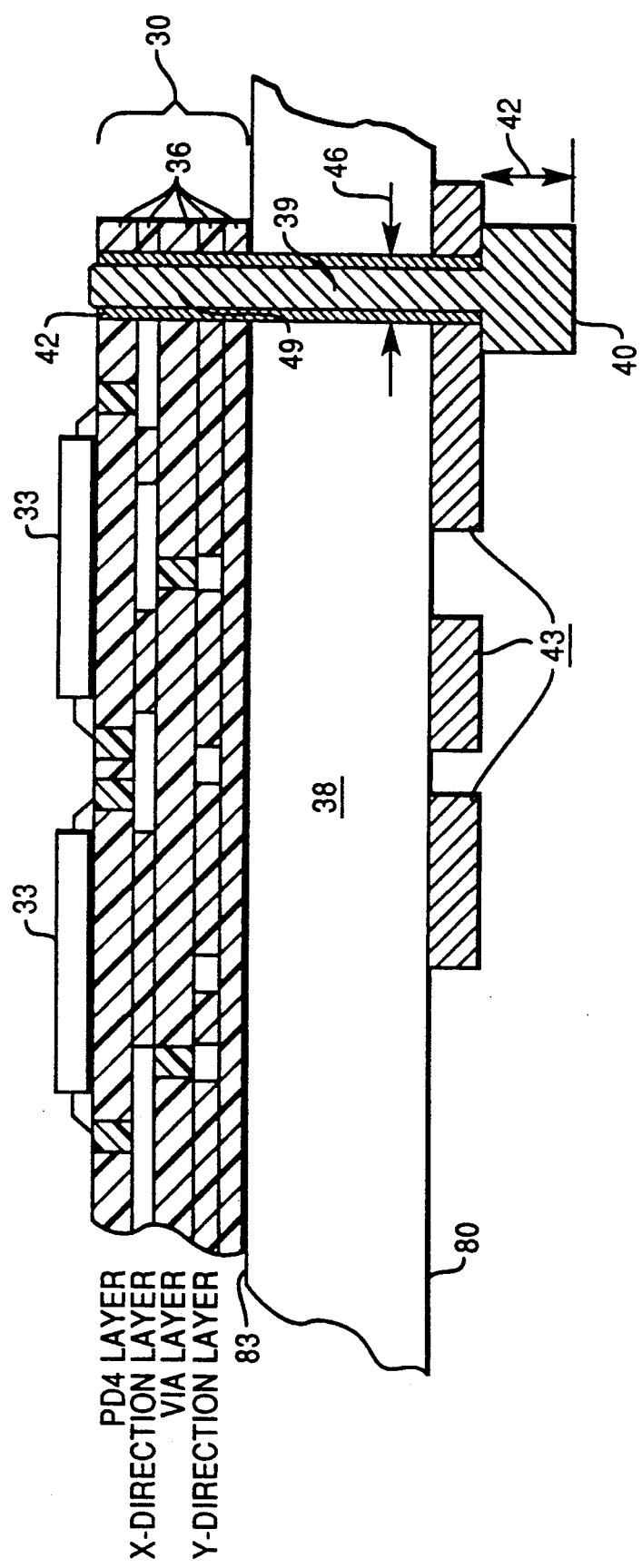
FIG. 3 illustrates one form of the invention.

FIG. 3 shows one form of the invention. A Flexible-Lamina stack 30 carries integrated circuits (ICs) 33. The term "flexible lamina" refers to the fact that the individual layers 36 are constructed of flexible dielectric sheets. The sheets can be a polyimide such as Mylar ®, 0.006 inches thick (i.e., 6 mils). The polyimide, Mylar ®, is available in sheets from DuPont Corporation, located in Delaware.

The sheets are plated with copper, in ½-, ¼-, or ⅛-ounce-per-square-foot weights (which correspond to respective thicknesses of 18-, 9-, or 5-microns). Such plating is commercially available from 3M Corporation, Austin, Tex.

The patterns of traces are produced by known photolithography techniques, giving a line width of less than 0.002 inches (i.e., less than 2 mils), and preferably 0.001 inches (i.e., 1 mil), with spacings of one or two mils between adjacent lines.

The Flexible Lamina stack 30 is attached to a conventional printed circuit (PC) board 38 by pins 39. The pins act as both mechanical connectors between the Flexible Lamina stack and the PC board and also as electrical connectors between the pads 42 on the stack 30 and traces 43 on the PC board. FIGS. 4–7 show greater detail of the inventive concept.

Figure 4:
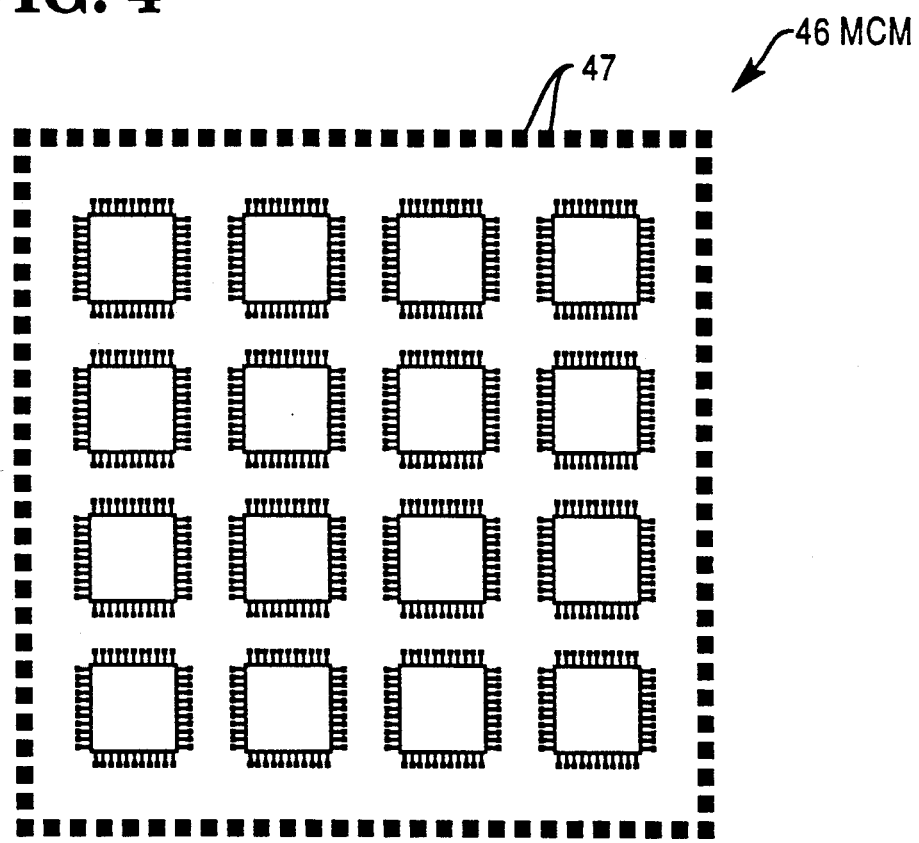
FIG. 4 is a top view of an interconnect medium 46 carrying integrated circuits 33.
Figure 5:
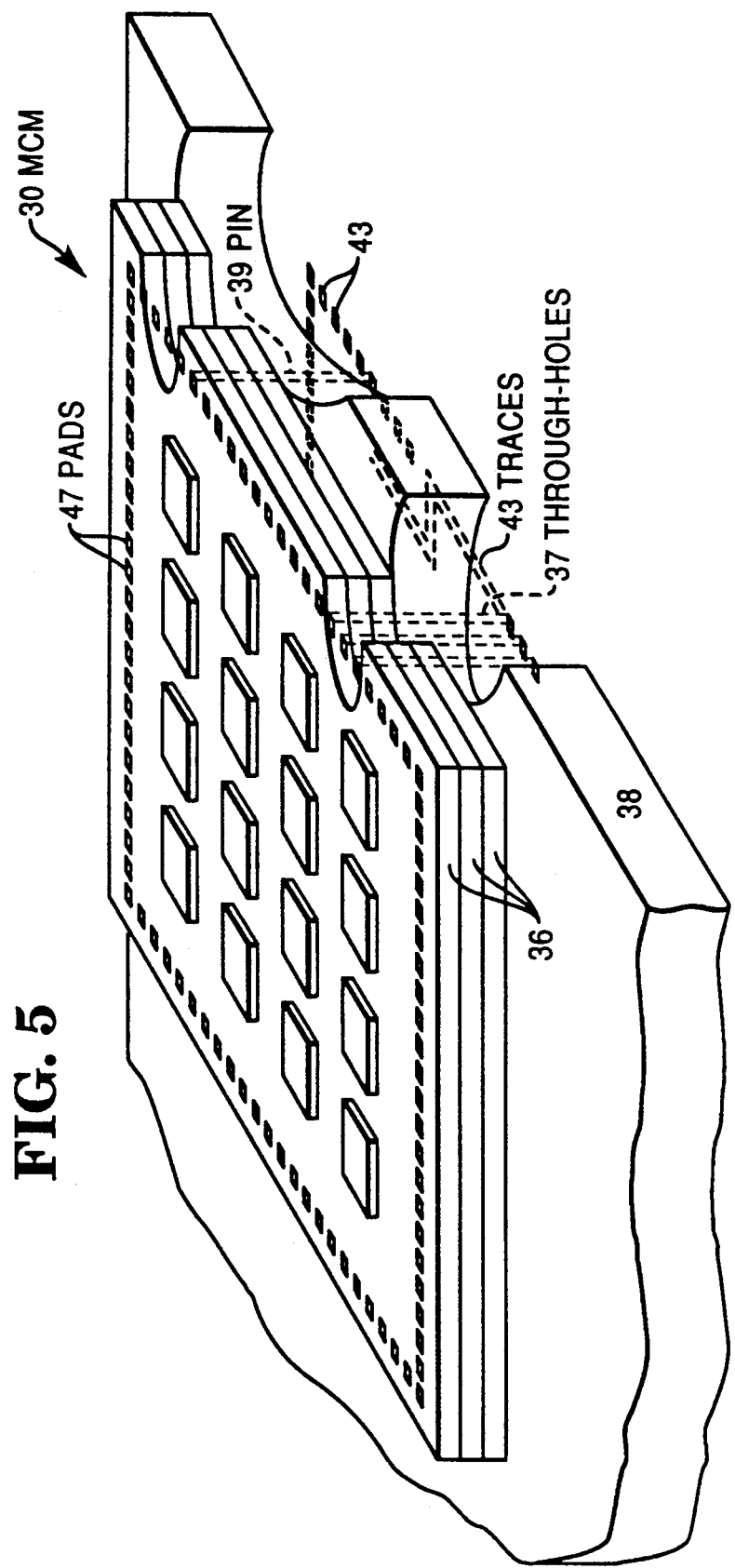
FIG. 5 is a cut-away perspective view of the interconnect medium of FIG. 4, mounted on a Printed Circuit (PC) board, as in FIG. 3.
Figure 6:
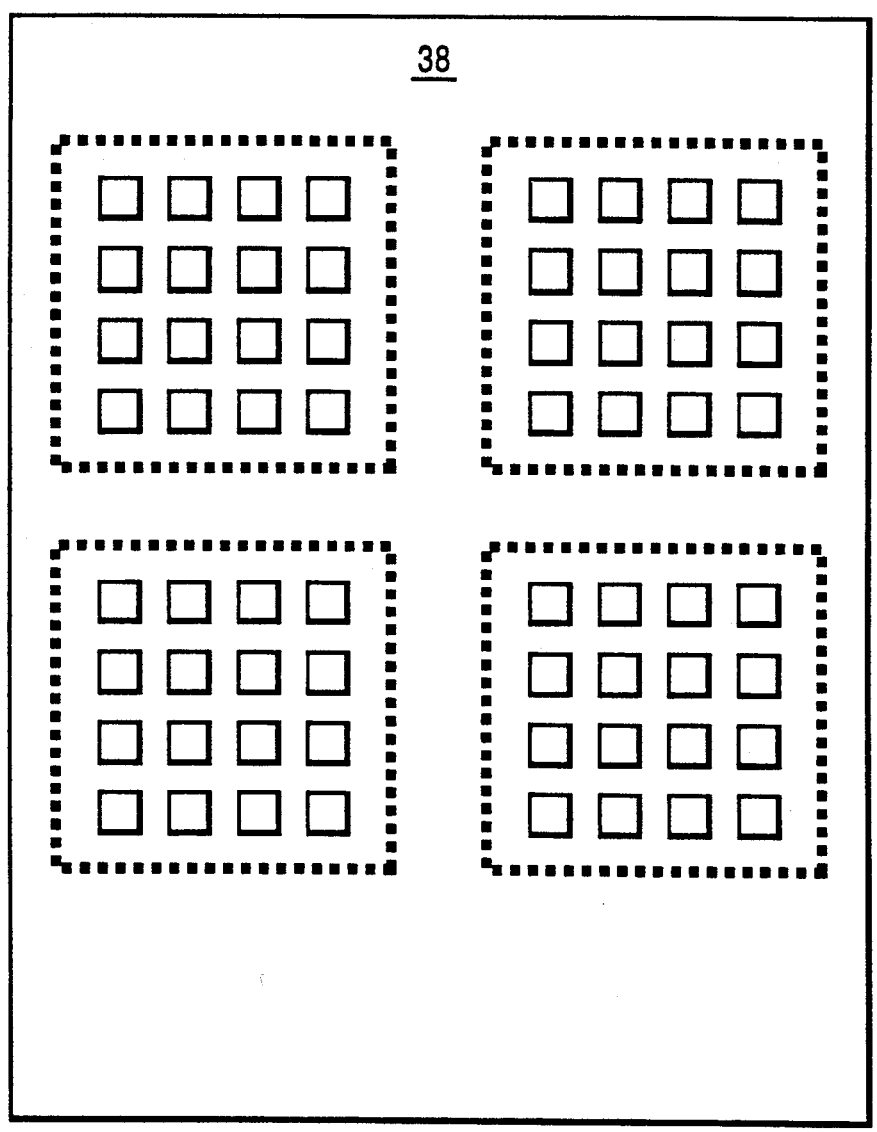
FIG. 6 is a top view of four MCMs mounted on a common PC board.
Figure 7:
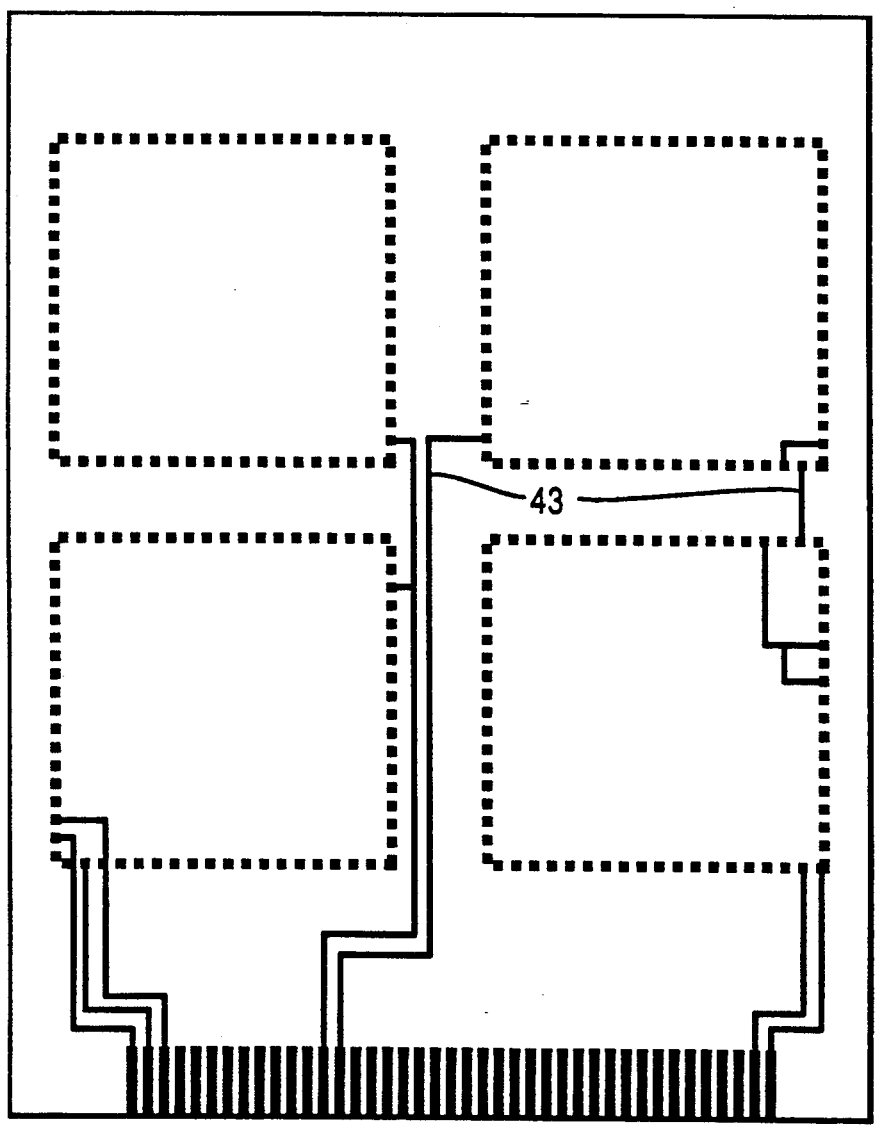
FIG. 7 is a bottom view of the PC board of FIG. 6.

FIG. 4 shows a top view of a Flexible Lamina Stack 46 carrying ICs 33. Conductive pads 47 are provided on the upper surface. FIG. 5 shows one such Flexible Lamina stack mounted on a conventional PC board 38. Holes 37 (not all shown) are drilled from each pad 47, through the stack and the PC board, to a respective trace 43. A pin 39, indicated by a dashed line, is inserted into the hole, and connects the pad with the trace. FIG. 6 shows a top view of a board carrying four Flexible Lamina stacks, and FIG. 7 shows a bottom view of the PC board, and a sample of the traces 43.

Several significant features of the invention are the following:

1. For the Flexible Lamina stacks, the polyimide, Mylar ®, is commercially available in rolls of standard widths, such as 40 inches. The large size allows photolithographic printing of the conductive traces to be done over a larger area, exposing many conductive patterns in one operation, thus reducing cost. The inventor estimates that one layer of sheet, bearing a completed trace pattern, will cost about $1.00 per square inch.

Figure 1:
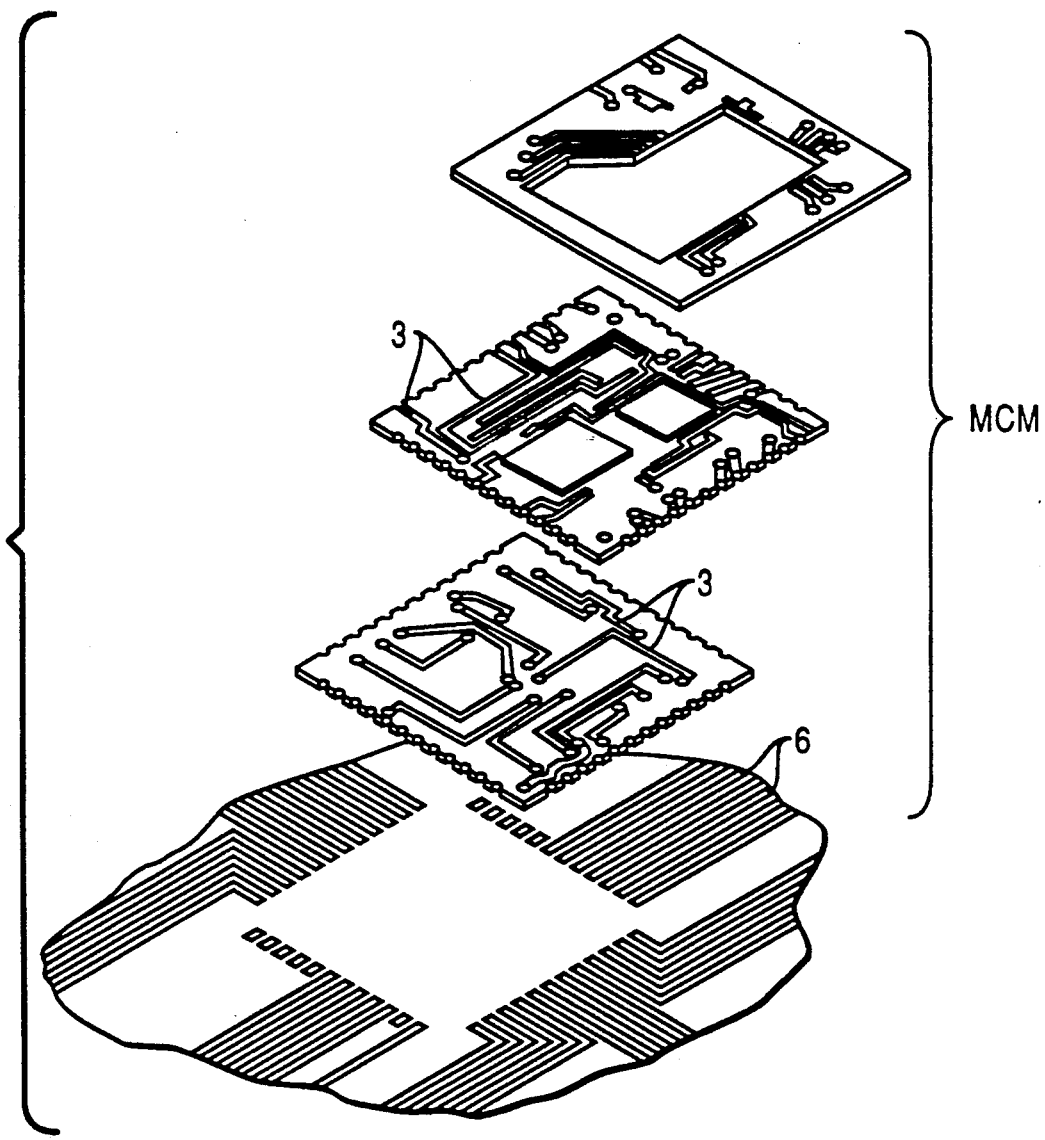
FIG. 1 illustrates a Multi-Chip Module of the prior art.
Figure 2:
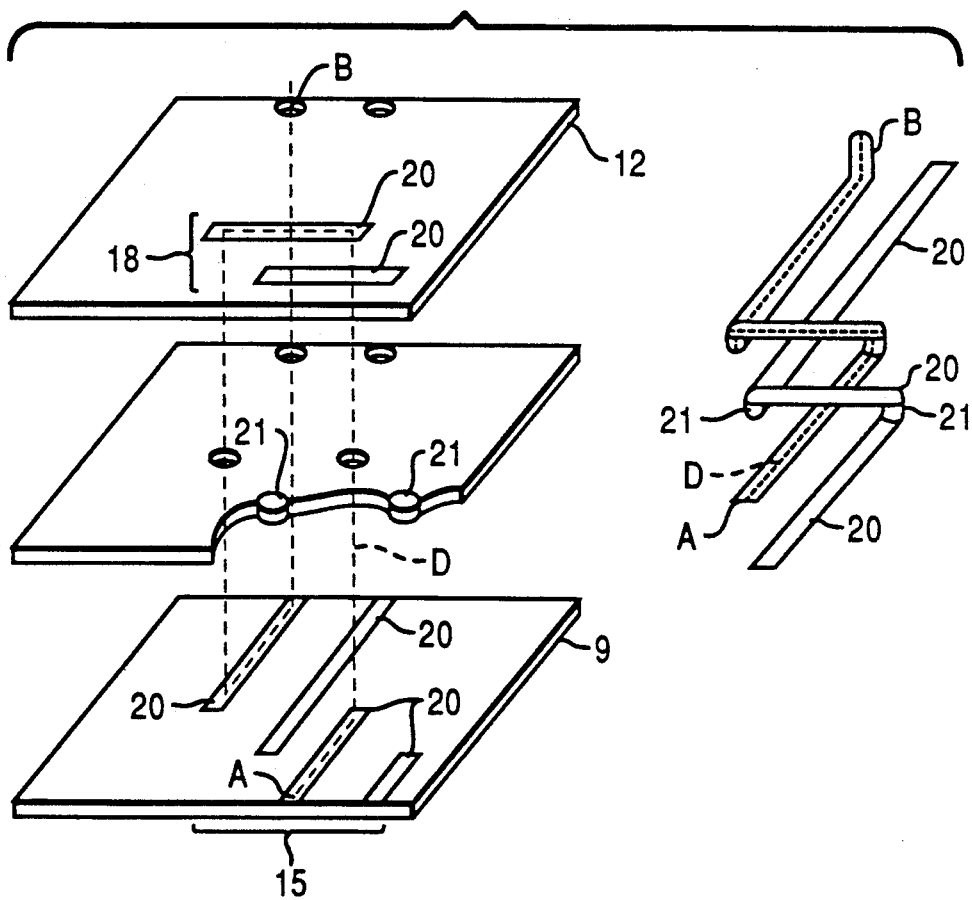
FIG. 2 illustrates how a 3-dimensional network is created in an MCM by interconnecting two layers of conductive traces.

The Flexible Lamina stack preferably uses three such sheets: two bearing patterns, such as patterns 15 and 18 in FIG. 2, and one bearing the patterns of vias 21.

2. One sheet can carry one type of pattern exclusively, or different patterns can be mixed on a given sheet. That is, for example, one sheet can carry exclusively the pattern 15 of vertical traces in FIG. 2, while another sheet can carry exclusively the pattern 18 of horizontal traces. This approach would require two photolithographic masters. Alternately, the two patterns can be printed on the same sheet, in the same step, and only a single master would be required.

3. The traces 43 in FIGS. 3 and 7, located on the printed circuit board, include power supply traces, as well as signal traces. Such power supply traces have a large cross-section, such as 0.1 inch × 18 microns, and thus provide a low-impedance connection.

4. The holes 37, or through-channels, in FIG. 5 need not be drilled prior to positioning of the Flexible Lamina stack adjacent the PC board. Instead, the lamina 36 can be stacked first, and the holes formed after stacking. Alternately, the Flexible Lamina stack can be first positioned on the PC board, and the holes drilled afterward. The holes can range in diameter from about 15 mils to 20 mils.

Programmable drilling machines which can repeatedly drill the patterns of holes are commercially available. In this connection, it is significant that the spacing between the pads is of the same order of magnitude as the spacing between the traces on the PC boards, namely, about 25 to 50 mils. Programmable drilling machines, as presently used in manufacturing PC boards, can accurately drill 12- to 20-mil holes on 30- to 60-mil centers.

5. The type of pin 39 shown in FIG. 3 has a head, or flange, 40. After insertion, a press fit holds the tail 49 of the pin to the Flexible Lamina stack, and the head 40 holds the PC board. Then the head and tail are soldered to their respective pads and traces.

The head may be eliminated. Under this approach, an adhesive can attach the Flexible Lamina stack to the PC-board, until soldering of the pins is completed.

6. Soldering was discussed above. It is recognized that different types of solder can be used, and that brazing or welding can be substituted for soldering.

Figure 8:
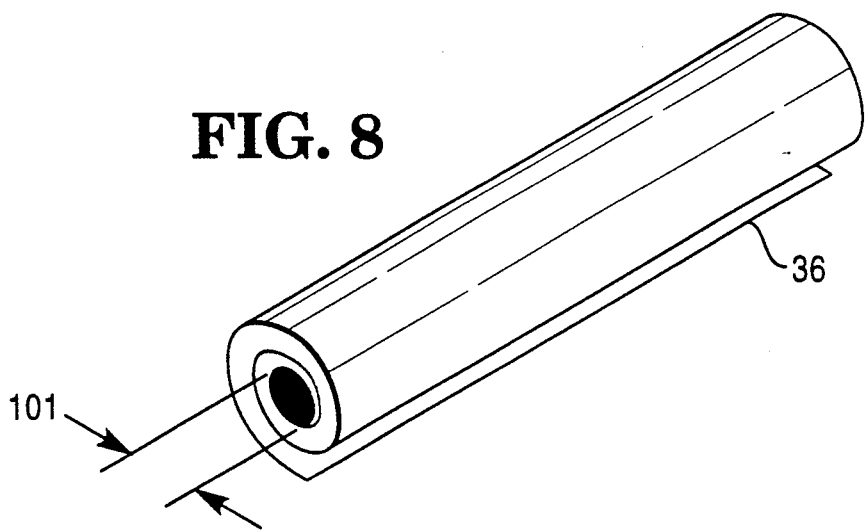
FIG. 8 illustrates a roll of sheet material, and a reference radius 101.

7. As stated above, the copper-plated layers 36 of the polyimide, Mylar ®, in FIG. 3 are supplied in long sheets and can be packaged in rolls. One such roll is shown in FIG. 8. The sheets are flexible, as indicated by the fact that they can be rolled around a radius 101 in FIG. 8 without damage. Radius 101 can be about 0.5 inches. However, when the layers 36 are stacked as shown in FIG. 3, the stack will become somewhat stiffer than the individual layers 36: the stack probably cannot be bent around the same radius 101 in FIG. 8 without damage. Thus, the layers are more flexible in their individual, separate states than when they are assembled into the stack. The layers can be described as "individually flexible," based on this characteristic.

8. The Flexible Lamina stack can be viewed as a multi-layer printed circuit board, but with two primary differences. One, the line width is smaller, because the Flexible Lamina stack uses photolithographic printing techniques for masking and etching. In contrast, PC boards customarily use silk-screen printing processes, which produce larger line widths. Two, the Flexible Lamina stack uses flexible substrates 36 in FIG. 3. PC boards generally use rigid substrates, such as glass-filled epoxy.

9. The term "Multi-Chip Module," or MCM, has been used. An MCM resembles a printed circuit board, but with a 3-dimensional network interconnecting the ICs, instead of a planar network, as in a standard PC board. The 3-dimensional network is formed by stacking individual PC boards, and interconnecting them. Other definitions of MCMs are possible.

Numerous substitutions and modifications can be undertaken without departing from the true spirit and scope of the invention, which provides an economical means of interconnecting ICs, for both power and signal transfer. What is desired to be secured by Letters Patent is the invention as defined in the following claims.

What is claimed is:

1. Apparatus for interconnecting Integrated Circuits (ICs), comprising:
   a) a multi-layered carrier for ICs, including a plurality of vertically stacked layers, such that
      i) each of the layers is individually flexible without heating;
      ii) a plurality of layers contain patterns of conductive traces, which patterns connect together to form a 3-dimensional network;
      iii) a plurality of ICs mounted on top of the multi-layered carrier and connected to the network;
      iv) a plurality of conductive pads on the carrier, connected to the network;
   b) a printed circuit board, carrying a plurality of conductive traces on one side and the multi-layered carrier on the other side; and
   c) a plurality of pins, each having a head portion and a tail portion, wherein the head portion holds the printed circuit board against the multi-layered carrier and the tail portion
      i) extends from one of the conductive traces of the printed circuit board, through the board, through the multi-layered carrier, and to one of the conductive pads and
      ii) bonds to the one conductive pad and the one conductive trace.

* * * * *